(12) United States Patent
Neidorff

(10) Patent No.: US 8,624,610 B2
(45) Date of Patent: Jan. 7, 2014

(54) SYNTHESIZED CURRENT SENSE RESISTOR FOR WIDE CURRENT SENSE RANGE

(75) Inventor: Robert Alan Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 414 days.

(21) Appl. No.: 13/032,887

(22) Filed: Feb. 23, 2011

(65) Prior Publication Data
US 2012/0212243 A1 Aug. 23, 2012

(51) Int. Cl.
*G01R 27/08* (2006.01)
*G01R 19/00* (2006.01)

(52) U.S. Cl.
USPC ............................. 324/713; 324/609; 702/64

(58) Field of Classification Search
USPC ............ 324/713, 691, 649, 600, 522; 702/64, 702/57, 1
See application file for complete search history.

(56) References Cited

U.S. PATENT DOCUMENTS

| 6,304,108 | B1 | 10/2001 | Inn | |
| 6,316,967 | B1 * | 11/2001 | Takagi et al. | 327/50 |
| 6,894,477 | B1 * | 5/2005 | Cuplin et al. | 324/117 R |
| 7,005,881 | B2 * | 2/2006 | Thiery | 324/762.09 |
| 7,872,372 | B1 * | 1/2011 | Voo | 307/52 |
| 2003/0184326 | A1 | 10/2003 | Throngnumchai | |
| 2004/0017252 | A1 * | 1/2004 | Miyazaki | 330/10 |
| 2004/0140817 | A1 * | 7/2004 | Nishino et al. | 324/713 |
| 2005/0017760 | A1 | 1/2005 | Grasso et al. | |
| 2006/0181289 | A1 | 8/2006 | Deboy et al. | |
| 2008/0231246 | A1 | 9/2008 | Sugie et al. | |
| 2009/0055672 | A1 * | 2/2009 | Burkland et al. | 713/340 |

FOREIGN PATENT DOCUMENTS

JP 2009080036 4/2009

OTHER PUBLICATIONS

Gray and Meyer, Analysis and Design of Analog Integrated Circuits, Third Ed., p. 676, 1993.
PCT Search Report mailed Sep. 12, 2012.

\* cited by examiner

*Primary Examiner* — Hoai-An D Nguyen
(74) *Attorney, Agent, or Firm* — William B. Kempler; Wade J. Brady, III; Frederick J. Telecky, Jr.

(57) ABSTRACT

A circuit has a first sense resistor circuit having components including a first-circuit active element to provide a sense resistance to sense a current in a load in series therewith, the sense resistance being established by an input command voltage. A second sense resistor circuit has components replicating the components of the first sense resistor circuit including a replicated active element, a resistance of the replicated active element also being established by the input command voltage. A precision resistor is coupled to the replicated active element to provide a load thereto. When the input command voltage establishes a voltage across the replicated active element, a voltage is established across the first-circuit active element in proportion thereto to command a desired current in the load.

20 Claims, 3 Drawing Sheets

SYNTHESIZED CURRENT SENSE RESISTOR FOR WIDE CURRENT SENSE RANGE

BACKGROUND

1. Field

The various circuit and method embodiments described herein relate in general to current sensing circuits and techniques, and, more specifically, to circuits and techniques to synthesize a sense resistor using an active component to enable current sensing over a large dynamic range.

2. Background

Current sense resistors are widely known. An example of a typical current sense resistor circuit 10 and its use is shown in FIG. 1, in which a sense resistor 11, a control device, such as a MOSFET 12, and a load 14 are connected in series between a voltage supply 16 and a reference potential 18. The current in the sense resistor 11 develops an output voltage across the sense resistor 11, which can be sensed by a current sense comparator 20. Typically, the circuit 10 senses current using the resistor 11 and looks for a specific voltage via the current sense comparator 20, representing a current threshold. The current sense resistor circuit 10 is accurate, stable, and inexpensive, but requires a significant voltage across the sense resistor 11, so that offset and noise are insignificant.

The circuit 10 implements a linear regulator that controls load current based on a voltage input, but is weak, because as the control signal that is applied drops, the signal across the sense resistor 11 also drops, and the offset and noise of the comparator 20 limit accuracy and performance.

Thus, when the current sense threshold adjusted in a system in which a current sense resistor circuit is used, either a very accurate current sense comparator 20 with very low offset is required, or a high resistance sense resistor 11 needs to be used. A high resistance sense resistor, however, drops an excessive voltage at high current and a barely adequate voltage at low current. Therefore, this solution is inefficient because a lot of power is wasted at high current level, and serious demands are placed on the comparator 20 at low current level.

Another current sensing technique that has been used is a current mirror 30, as shown in FIG. 2. The current mirror 30 has a reference side having a reference current source 32 and MOSFET 34 connected in series and a mirror side having MOSFETs 36 and 12 and load 14 connected in series between the voltage source 16 and reference potential 18. The current from the reference current source 32 is driven through the MOSFET 34 to create a voltage on its gate and on the gate of a sensing MOSFET 36, thereby setting its resistance. The current through the sensing MOSFET 36 develops a voltage on its drain, which is sensed by the comparator 20.

Typically, the reference current portion of the current mirror 30 is provided from an external current. This allows scaling but does not actually generate a voltage proportional to current, which is used for feed-forward and other purposes.

What is needed is a circuit that provides a stable and predictable sense resistance that can sense control currents over a wide dynamic range to provide a constant voltage threshold for good accuracy and high efficiency.

SUMMARY

According to the concepts described herein, a feedback circuit is employed to synthesize a resistor using a MOSFET or other active component. By using two synthesizers with matched, and possibly scaled devices, an external, accurate reference resistor can be employed so that the synthesized resistance is stable and predictable. A multiplier or other converter in the system can be used to scale the synthesized resistor with the current command signal, so that when a low current is commanded, a high resistance is synthesized. This allows a constant voltage threshold, for good accuracy and high efficiency.

Thus, in one example described herein, a load current sensing circuit has a first sense resistor circuit to sense a current in a load in series therewith and a second sense resistor circuit having components replicating the components of the first sense resistor circuit. A resistor is coupled to the second sense resistor circuit. When an input command voltage is applied to the first and second sense resistor circuits to establish a predetermined response in the second sense resistor circuit, a predetermined sense resistance is established in the first sense resistor circuit.

In another example, a circuit is described having a first sense resistor circuit having components including a first-circuit active element to provide a sense resistance established by an input command voltage to sense a current in a load in series therewith. A second sense resistor circuit has components replicating the components of the first sense resistor circuit including a replicated active element, a resistance of the replicated active element also being established by the input command voltage. A precision resistor is coupled to the replicated active element to provide a load thereto. When the input command voltage establishes a voltage across the replicated active element, a voltage is established across the first-circuit active element in proportion thereto.

In yet another example, a method is described for sensing a load current. The method includes providing a first sense resistor circuit having a first-circuit active element for connection in series with a load to provide a sense resistance in accordance with an input command voltage applied thereto. The first sense resistor circuit is replicated with a replicated sense resistor circuit having a replicated active element. A precision resistor is coupled to the replicated active element. When the input command voltage is applied to the replicated active element and adjusted to produce a predetermined voltage across the replicated active element, a predetermined sense resistance is established in the first circuit active element.

BRIEF DESCRIPTION OF THE DRAWINGS

In the various figures of the drawing, like reference numbers are used to denote like or similar parts.

DETAILED DESCRIPTION

Figure 1:
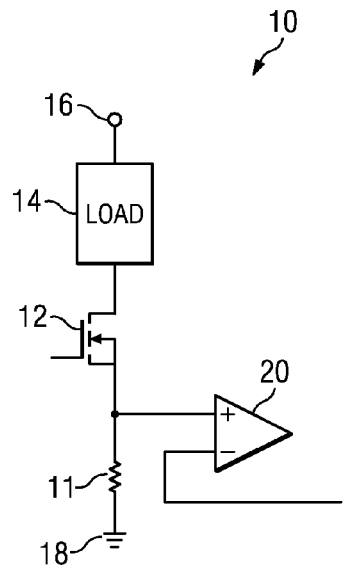
FIG. 1 is an electrical schematic diagram showing an example of a typical current sense resistor and its use, according to the prior art.
Figure 2:
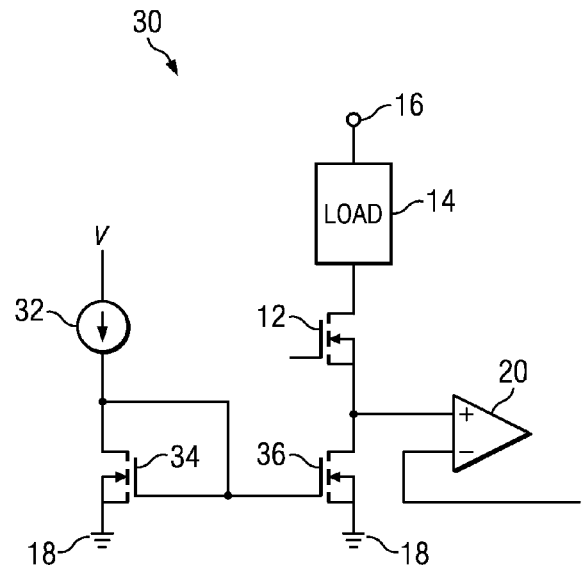
FIG. 2 is an electrical schematic diagram showing an example of a current mirror sensing technique, according to the prior art.
Figure 3:
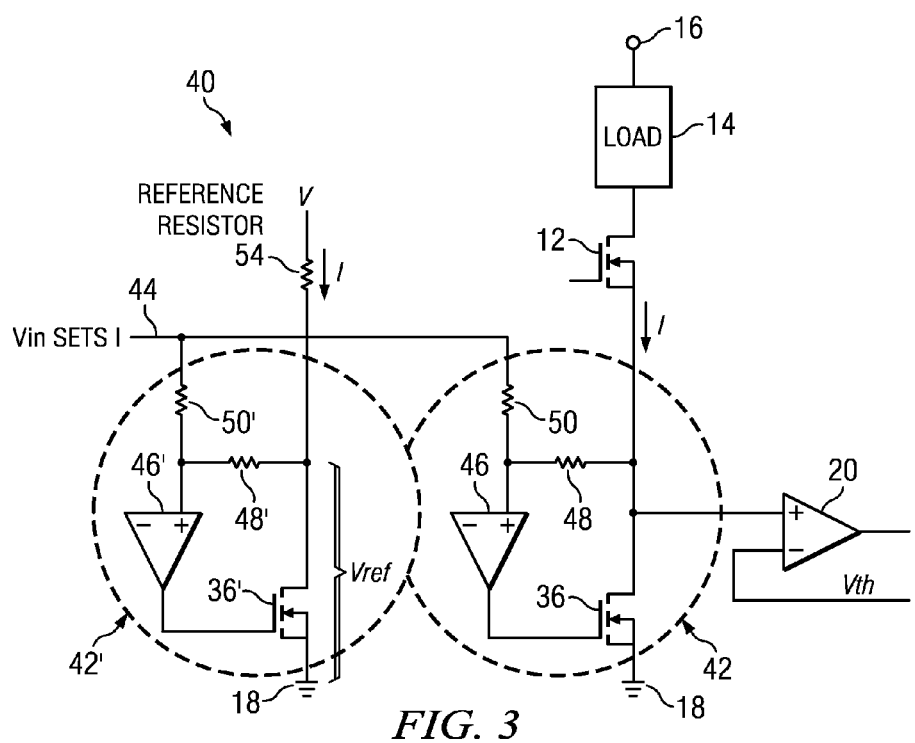
FIG. 3 is an electrical schematic diagram showing an example of circuit by which a sense resistor can be synthesized to establish a sense resistance in a circuit under load.

Broadly, a method and circuit are shown by which a sense resistor can be synthesized by producing a replicated or synthesized precision sense resistor in an ideal environment and from which the sense resistor under actual load can be configured. This can be accomplished in a number of ways, an example of one circuit 40 being shown in FIG. 3, to which reference is now made.

In the circuit 40, a first sense resistor circuit 42 is provided that has components that include a first-circuit active element, MOSFET 36. The MOSFET 36 provides a sense resistance to sense a current, I, in a load 14 in series therewith. The resistance of the MOSFET 36 is established as described below.

The circuit 40 may be used in many current limit applications; for example, it may be used in dimmable lighting applications where it is desired to control current in an LED load, or the like, with one circuit over a wide dynamic range, for instance over a range of 100:1 or 1000:1. Alternatively, it may be used to serve as a primary side current sense LED driver, or the like in which in which the current in the load 14 may be switched or controlled by a control device, such as a MOSFET 12, or the like, in known manner.

The resistance of the MOSFET 36 is controlled by an input command voltage, Vin, on line 44, in a manner described below in greater detail. The voltage developed across the MOSFET 36 is connected to a comparator or regulating amplifier 20, which compares the voltage to a threshold voltage, Vth, as shown. Although a comparator or regulating amplifier 20 is shown as an illustrative use for the circuit 40, any circuit or other circuit that operates based on the information derived from the voltage across the synthesized resistance can be equally advantageously employed. Moreover, the circuit need not have a single fixed threshold.

In the example illustrated, the first sense resistor circuit 42 has an amplifier 46 with its output connected to the gate of the MOSFET 36. The amplifier 46 may be, for instance, an operational amplifier, but may have a modest gain between about 2 and 5, for example. A feedback resistor 48 is connected between the drain of the MOSFET 36 and the input of the amplifier 46, and a resistor 50 is connected between the input of the amplifier 46 and the input command voltage, Vin, on line 44.

A second sense resistor circuit 42', sometimes referred to herein as a replicated sense resistor circuit, is provided having components substantially replicating the components of the first sense resistor circuit 42. Thus, the second sense resistor circuit 42' has a replicated active element, MOSFET 36', the resistance of which being established by the input command voltage, Vin, on line 44. Like the first sense resistor circuit 42, the second sense resistor circuit 42' has an amplifier 46' with its output connected to the gate of the MOSFET 36'. The amplifier 46' may be, for instance, an operational amplifier of construction that is substantially the same as that of the amplifier 46.

A feedback resistor 48' is connected between the drain of the MOSFET 36' and the input of the amplifier 46', and a resistor 50' is connected between the input of the amplifier 46' and the input command voltage, Vin, on line 44. The values of the resistors 48' and 50' may be substantially the same as the values of the resistors 48 and 50 of the first sense resistor circuit 42.

A reference resistor 54, which may be a precision resistor, is connected in series between a supply voltage, V, and the MOSFET 36' to provide a precision load thereto. Thus, when an input command voltage, Vin, on line 44 establishes a voltage, Vref, across the MOSFET 36' it also established a voltage across the MOSFET 36 in the first sense resistor circuit 42 in proportion thereto to establish the resistance provided by the MOSFET 36. It should be noted the MOSFETs 36 and 36' are partially resistive on their own, and when they are used in the feedback circuit as described, they can be made to behave like variable linear resistors.

Figure 4:
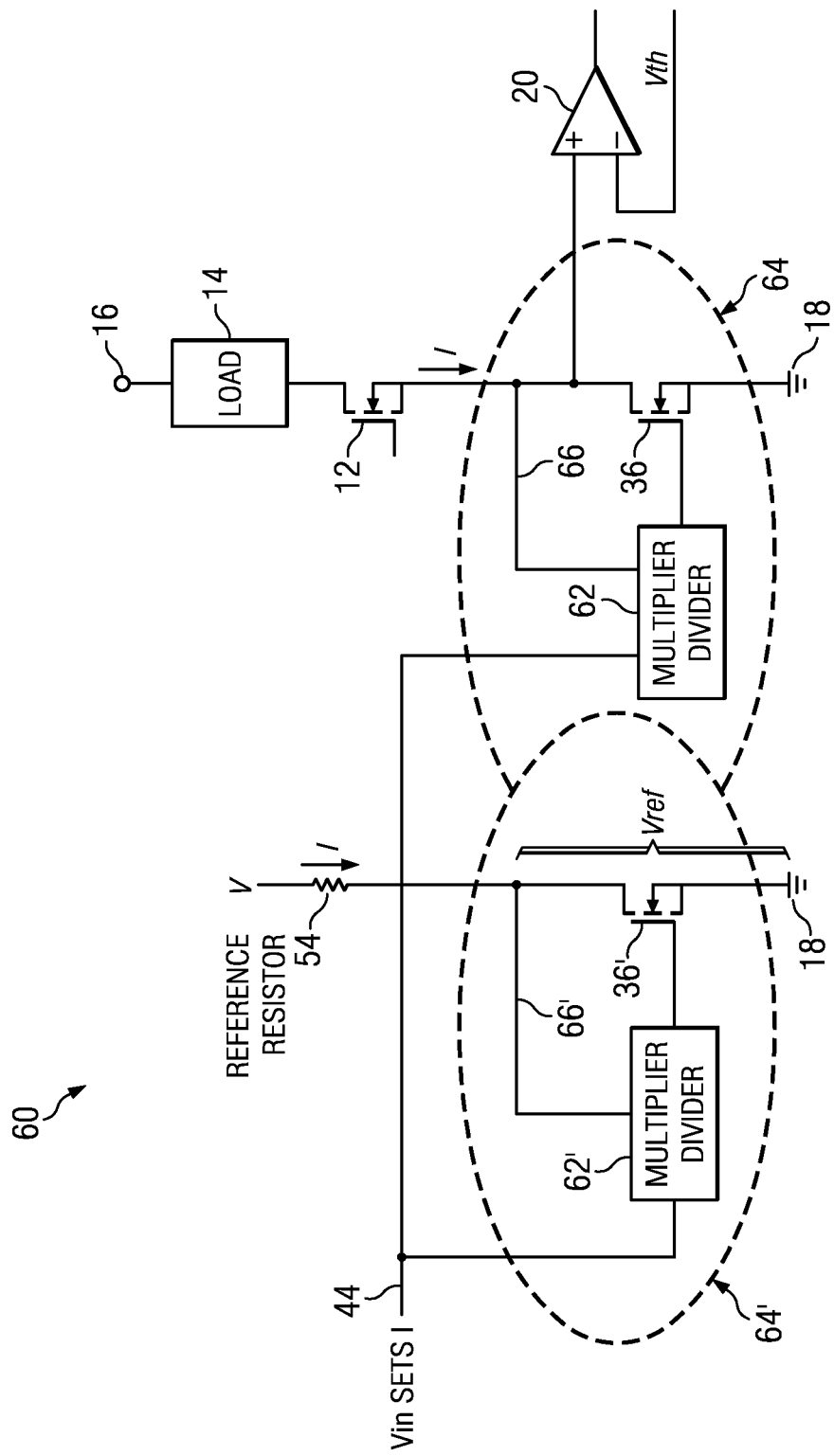
FIG. 4 is an electrical schematic diagram showing another example of a circuit by which a sense resistor can be synthesized to establish a sense resistance in a circuit under load.

Another embodiment of the sense resistor synthesizer circuit is shown in FIG. 4 to which reference is now additionally made. In the circuit 60, a first sense resistor circuit 64 has a first-circuit active element, MOSFET 36, to provide a sense resistance to sense a current, I, in a load 14 in series therewith. The sense resistance of the MOSFET 36 is established by an input command voltage, Vin on line 44, which is applied through multiplier/divider circuit 62 to the gate of the MOSFET 36. A line 66 connects the drain of the MOSFET 36 to the multiplier/divider circuit 62.

In a similar manner as described above, the voltage developed across the MOSFET 36 is connected to a comparator or regulating amplifier 20, which compares the voltage to a threshold voltage, Vth, as shown. Although a comparator or regulating amplifier 20 is shown as an illustrative use for the circuit 60, any circuit or other circuit that operates based on the information derived from the voltage across the synthesized resistance can be equally advantageously employed. Moreover, the circuit need not have a single fixed threshold.

A second sense resistor circuit 64' has components replicating the components of the first circuit, including a replicated active element, MOSFET 36', to provide a sense resistance to sense a current, I, in a precision reference resistor 54 in series therewith.

The sense resistance of the MOSFET 36' is also established by the input command voltage, Vin on line 44, which is applied through multiplier/divider circuit 62' to the gate of the MOSFET 36'. A line 66 connects the drain of the MOSFET 36 to the multiplier/divider circuit 62.

A reference resistor 54, which may be a precision resistor, is connected in series between a supply voltage, V, and the MOSFET 36' to provide a precision load thereto. When the input command voltage is applied to the multiplier/divider circuit 62', a voltage, Vref, is established across the MOSFET 36'. In addition, a voltage is also established across the MOSFET 36 in the first sense resistor circuit 64 in proportion thereto. Thus, by establishing the predetermined current, I, in the replicated sense resistor circuit 64', the resistance provided by the MOSFET 36 in the first sense resistor circuit 64, hence the current, I, in the load 14, is established.

It should again be noted the MOSFETs 36 and 36' are partially resistive on their own, and when they are used in the feedback circuit with the multiplier/divider circuits 62 and 62', as described, they can be made to behave like variable linear resistors. Moreover, although MOSFET devices are shown for illustration in the circuit embodiments of FIGS. 3 and 4, any active device, and more particularly, any device in which current is a function of input, can be used with a feedback circuit to achieve the synthesized resistor function described.

Figure 5:
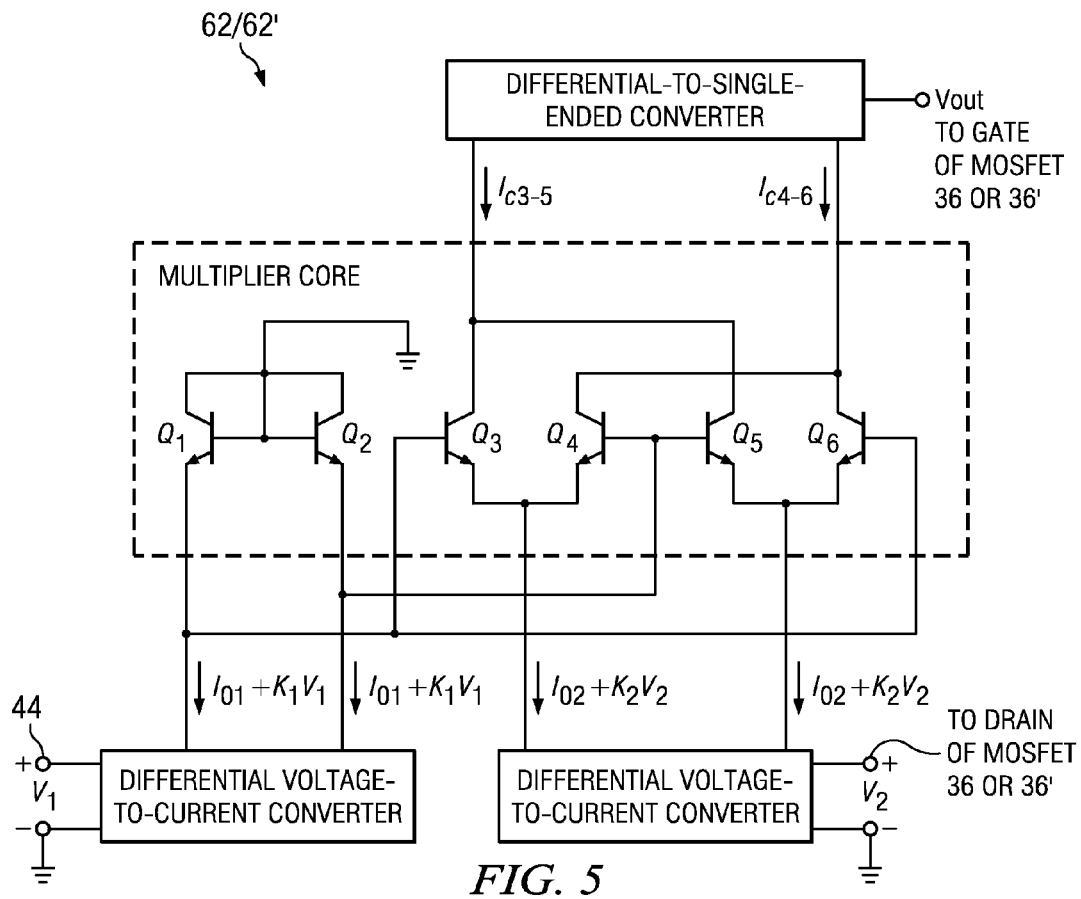
FIG. 5 is an example of a multiplier/divider circuit that can be instantiated in the circuit of FIG. 4.

With reference additionally now to FIG. 5, an example of a circuit 62/62' is shown, instantiations of which can serve as the respective multiplier/dividers 62 and 62' in the circuit 60 of FIG. 4. As can be seen, the circuit 62/62' has voltage inputs, respectively from line 44 and from the drain of an associated MOSFET 36 or 36'. The voltage output is connected to the gate of the associated MOSFET 36 or 36'. Of course, the circuit 62/62' is shown merely as an example, and other multiplier/divider circuits may be equally advantageously employed.

Like the circuit 40, the circuit 60 may be used in many current limit applications; for example, it may be used in dimmable lighting applications where it is desired to control current with one circuit over a wide dynamic range, for instance over a range of 100:1 or 1000:1. Alternatively, it may be used to serve as a primary side current sense LED driver, or the like in which the load 14 may be, for example, LEDs, or the like. The current in the load 14 may be switched or controlled by a control device, such as a MOSFET 12, or the like, in known manner.

Thus, it can be seen that circuits of the type exemplified by circuit 40, circuit 60, or the like, enable the value of the sense resistance provided by the active elements described to be established to any desired value. As the active elements invert the input voltage, the higher the input command voltage, the lower the resistance of the active elements. With the replicated circuits, as described, significant technical advantages can be achieved, including high efficiency, low cost, and high accuracy.

In addition, it should be appreciated that although the components of the replicated circuit, for instance sense resistor circuits 42' and 64' may be substantially identical to the components of the first sense resistor circuits 42 and 64 in the examples illustrated, the components of the replicated circuit may have a predetermined proportionality with respect to the components of the first circuit. More particularly, the channel of the MOSFET in the replicated circuit may be twice, half, or other factor, as wide as the channel of the MOSFET in the first circuit. The values of the resistors, or other components, of the replicated circuit can be selected to have a predetermined ratio with respect to the corresponding components of the first circuit, and so on. In this case, the value of the current produced in the reference resistor of the replicated circuit can be correlated to the value of the resistance produced in the first-circuit active element.

Figure 6:
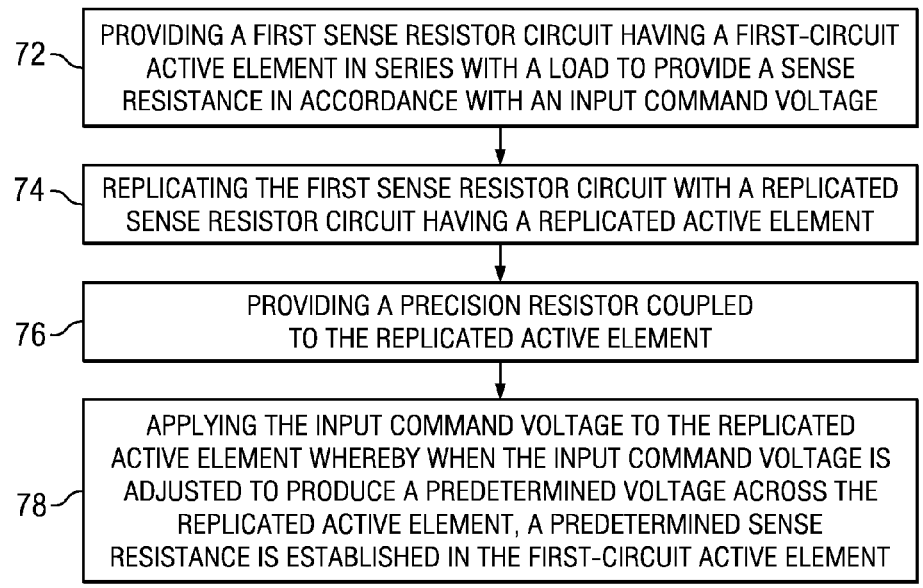
FIG. 6 is a flow diagram illustrating steps in performing a method for synthesizing a sense resistor that is used to establish a sense resistance in a circuit under load.

According to a method embodiment for sensing a load current, with reference now additionally to the flow chart 70 in FIG. 6, box 72 illustrates providing a first sense resistor circuit having a first-circuit active element for connection in series with a load to provide a sense resistance in accordance with an input command voltage applied thereto. Box 74 illustrates replicating the first sense resistor circuit with a replicated sense resistor circuit having a replicated active element.

Box 76 illustrates providing a precision resistor coupled to the replicated active element. And box 78 illustrates applying an input command voltage to the replicated active element, whereby when the input command voltage is adjusted to produce a predetermined voltage across the replicated active element, a predetermined sense resistance is established in the first circuit active element, thereby controlling the current, I, in the load 14.

Additionally, it will be appreciated that many of the circuit elements disclosed herein are of particular types, for example, MOSFET devices or bipolar junction transistors of certain conductivities (for example, p-channel, n-channel, npn or pnp). It will be understood that other transistor types and other transistor conductivities may be equally advantageously employed with appropriate circuit or supply voltage changes.

Electrical connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. A load current sensing circuit, comprising:
   a first sense resistor circuit having components to sense a current in a load in series therewith;
   a second sense resistor circuit having components replicating said components of said first sense resistor circuit;
   a resistor coupled to said second sense resistor circuit;
   whereby when an input command voltage is applied to said first and second sense resistor circuits to establish a predetermined response in said second sense resistor circuit, a predetermined sense resistance is established in said first sense resistor circuit.

2. The load current sensing circuit of claim 1 wherein said first sense resistor circuit comprises a first-circuit active element to provide a sense resistance and said second sense resistor circuit comprises a replicated active element, wherein resistances of said first-circuit active element and said replicated active element are established by an input command voltage.

3. The load current sensing circuit of claim 1 wherein said first-circuit active element and said replicated active element are MOSFETs.

4. The load current sensing circuit of claim 3 wherein said first sense resistor circuit and said second sense resistor circuits comprise substantially similarly constructed circuits each comprising:
   an amplifier having an output connected to a gate of a respective MOSFET;
   a first resistor connected between a drain of said respective MOSFET and an input of said amplifier;
   and a second resistor connected to said input command voltage.

5. The load current sensing circuit of claim 3 wherein said first sense resistor circuit and said second sense resistor circuits comprise substantially similarly constructed circuits each comprising a multiplier/divider circuit connected between said input command voltage and respective MOSFETs to control a resistance of said respective MOSFETs in response to said input command voltage.

6. The load current sensing circuit of claim 1 further comprising a control device connected between said load and said first-circuit active element to switchably control said current in said load.

7. A circuit, comprising:
   a first sense resistor circuit having components including a first-circuit active element to provide a sense resistance to sense a current in a load in series therewith, said sense resistance being established by an input command voltage;
   a second sense resistor circuit having components replicating said components of said first sense resistor circuit including a replicated active element, a resistance of said replicated active element also being established by said input command voltage;
   a resistor coupled to said replicated active element to provide a load thereto;
   whereby when said input command voltage establishes a voltage across said replicated active element, a voltage is established across said first-circuit active element by said current in said load in proportion to said input command voltage.

8. The circuit of claim 7 wherein said first-circuit active element is a MOSFET, and further comprising:

an amplifier having an output connected to a gate of said MOSFET;

a first resistor connected between a drain of said MOSFET and an input of said amplifier;

and a second resistor connected to said input command voltage.

9. The circuit of claim 7 wherein said first-circuit active element is a MOSFET, and further comprising a multiplier/divider circuit connected between said input command voltage and said MOSFET to control a resistance of said MOSFET in response to said input command voltage.

10. The circuit of claim 7 wherein said component values and configurations of said first and second circuits are substantially the same.

11. The circuit of claim 7 further comprising a comparator connected to compare a voltage across said sense resistance to a threshold voltage.

12. The circuit of claim 7 further comprising a control device connected between said load and said first-circuit active element to switchably control said current in said load.

13. The circuit of claim 12 wherein said control device is a MOSFET.

14. A method for sensing a load current, comprising:

providing a first sense resistor circuit having a first-circuit active element for connection in series with a load to provide load current sense resistor having a sense resistance in accordance with an input command voltage applied thereto;

replicating said first sense resistor circuit with a replicated sense resistor circuit having a replicated active element;

providing a resistor coupled to said replicated active element;

applying said input command voltage to said replicated active element;

whereby when said input command voltage is adjusted to produce a predetermined voltage across said replicated active element, a predetermined sense resistance is established in said first circuit active element.

15. The method of claim 14 wherein:

said providing a first-circuit active element comprises providing a MOSFET; and said providing a first sense resistor circuit comprises providing an amplifier having an output connected to a gate of said MOSFET, a first resistor connected between a drain of said MOSFET and an input of said amplifier, and a second resistor connected to said input command voltage.

16. The method of claim 14 wherein said providing a first-circuit active element comprises providing a MOSFET, and further comprising providing a multiplier/divider circuit connected between said input command voltage and said MOSFET to control a resistance of said MOSFET in response to said input command voltage.

17. The method of claim 14 wherein said replicating said first sense resistor circuit comprises providing component values and configurations of said first sense resistor and replicated circuits that are substantially the same.

18. The method of claim 14 further comprising providing a comparator connected to compare a voltage across said first-circuit active element to a threshold voltage.

19. The method of claim 14 further comprising a control device connected between said load and said first-circuit active element to switchably control said current in said load.

20. The method of claim 19 wherein said control device is a MOSFET.

* * * * *